(12) United States Patent
Chiu et al.

(10) Patent No.: US 9,847,401 B2
(45) Date of Patent: Dec. 19, 2017

(54) SEMICONDUCTOR DEVICE AND METHOD OF FORMING THE SAME

(71) Applicant: TAIWAN SEMICONDUCTOR MANUFACTURING COMPANY, LTD., Hsinchu (TW)

(72) Inventors: Han-Chin Chiu, Kaohsiung (TW); Hsing-Lien Lin, Hsinchu (TW); Cheng-Yuan Tsai, Chu-Pei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/185,177

(22) Filed: Feb. 20, 2014

(65) Prior Publication Data
US 2015/0236121 A1    Aug. 20, 2015

(51) Int. Cl.
| | |
|---|---|
| H01L 29/66 | (2006.01) |
| H01L 29/778 | (2006.01) |
| H01L 21/02 | (2006.01) |
| H01L 29/51 | (2006.01) |
| H01L 23/29 | (2006.01) |
| H01L 29/417 | (2006.01) |
| H01L 29/20 | (2006.01) |
| H01L 29/201 | (2006.01) |
| H01L 29/207 | (2006.01) |

(52) U.S. Cl.
CPC .... H01L 29/66462 (2013.01); H01L 21/0251 (2013.01); H01L 21/0254 (2013.01); H01L 21/0262 (2013.01); H01L 21/02458 (2013.01); H01L 21/02505 (2013.01); H01L 29/513 (2013.01); H01L 29/7786 (2013.01); H01L 23/291 (2013.01); H01L 29/201 (2013.01); *H01L 29/2003* (2013.01); *H01L 29/207* (2013.01); *H01L 29/41766* (2013.01); *H01L 2924/0002* (2013.01)

(58) Field of Classification Search
CPC ......... H01L 2924/13064; H01L 29/778; H01L 29/7787; H01L 29/66431; H01L 29/66462
See application file for complete search history.

(56) References Cited

U.S. PATENT DOCUMENTS

| | | | |
|---|---|---|---|
| 7,112,830 B2 | 9/2006 | Munns | |
| 7,547,925 B2 | 6/2009 | Wong et al. | |
| 8,803,158 B1 * | 8/2014 | Chiu | H01L 29/2003 |
| | | | 257/194 |
| 2007/0108456 A1 | 5/2007 | Wong et al. | |
| 2011/0001127 A1 * | 1/2011 | Sakamoto | H01L 21/02381 |
| | | | 257/22 |
| 2012/0193637 A1 * | 8/2012 | Kalnitsky et al. | 257/76 |
| 2013/0082307 A1 * | 4/2013 | Okamoto | H01L 21/28581 |
| | | | 257/279 |
| 2013/0140525 A1 * | 6/2013 | Chen | H01L 21/02381 |
| | | | 257/22 |
| 2015/0060873 A1 * | 3/2015 | Chiu et al. | 257/76 |

OTHER PUBLICATIONS

Srivastava, P., et al., "Si Trench Around Drain (STAD) Technology of GaN-DHFETs on Si Substrate for Boosting Performance", IEEE, 2001.

* cited by examiner

*Primary Examiner* — Thanhha Pham
(74) *Attorney, Agent, or Firm* — Hauptman Ham, LLP

(57) ABSTRACT

A semiconductor device comprising a substrate, a channel layer over the substrate, an active layer over the channel layer and a laminate layer in contact with the active layer. The active layer has a band gap discontinuity with the channel layer.

17 Claims, 12 Drawing Sheets

SEMICONDUCTOR DEVICE AND METHOD OF FORMING THE SAME

RELATED APPLICATIONS

The instant application is related to the following U.S. patent applications:

U.S. patent application titled "TRANSISTOR HAVING PARTIALLY OR WHOLLY REPLACED SUBSTRATE AND METHOD OF MAKING THE SAME," U.S. application Ser. No. 13/944,779;

U.S. patent application titled "TRANSISTOR HAVING HIGH BREAKDOWN VOLTAGE AND METHOD OF MAKING THE SAME," U.S. application Ser. No. 13/944,713;

U.S. patent application titled "TRANSISTOR HAVING BACK-BARRIER LAYER AND METHOD OF MAKING THE SAME," U.S. application Ser. No. 13/944,584;

U.S. patent application titled "TRANSISTOR HAVING DOPED SUBSTRATE AND METHOD OF MAKING THE SAME," U.S. application Ser. No. 13/944,494;

U.S. patent application titled "TRANSISTOR HAVING A BACK-BARRIER LAYER AND METHOD OF MAKING THE SAME," U.S. application Ser. No. 13/944,672;

U.S. patent application titled "TRANSISTOR HAVING OHMIC CONTACT BY GRADIENT LAYER AND METHOD OF MAKING SAME" U.S. application Ser. No. 14/010,268;

U.S. patent application titled "TRANSISTOR HAVING AN OHMIC CONTACT BY SCREEN LAYER AND METHOD OF MAKING THE SAME" U.S. application Ser. No. 14/010,220;

U.S. patent application titled "TRANSISTOR HAVING METAL DIFFUSION BARRIER AND METHOD OF MAKING THE SAME," U.S. application Ser. No. 13/948,925; and U.S. patent application titled "SEMICONDUCTOR DEVICE, HIGH ELECTRON MOBILITY TRANSISTOR (E-HEMT) AND METHOD OF MANUFACTURING," U.S. application Ser. No. 13/944,625.

The entire contents of the above-referenced applications are incorporated by reference herein.

BACKGROUND

In semiconductor technology, Group III-Group V (or III-V) semiconductor compounds are used to form various integrated circuit devices, such as high power field-effect transistors, high frequency transistors, high electron mobility transistors (HEMTs), or metal-insulator-semiconductor field-effect transistors (MISFETs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and high electron drift velocity under a high electric field which enable devices to operate at high frequencies and high voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The drawings, which are incorporated herein, include the following in which.

DETAILED DESCRIPTION

Figure 1:
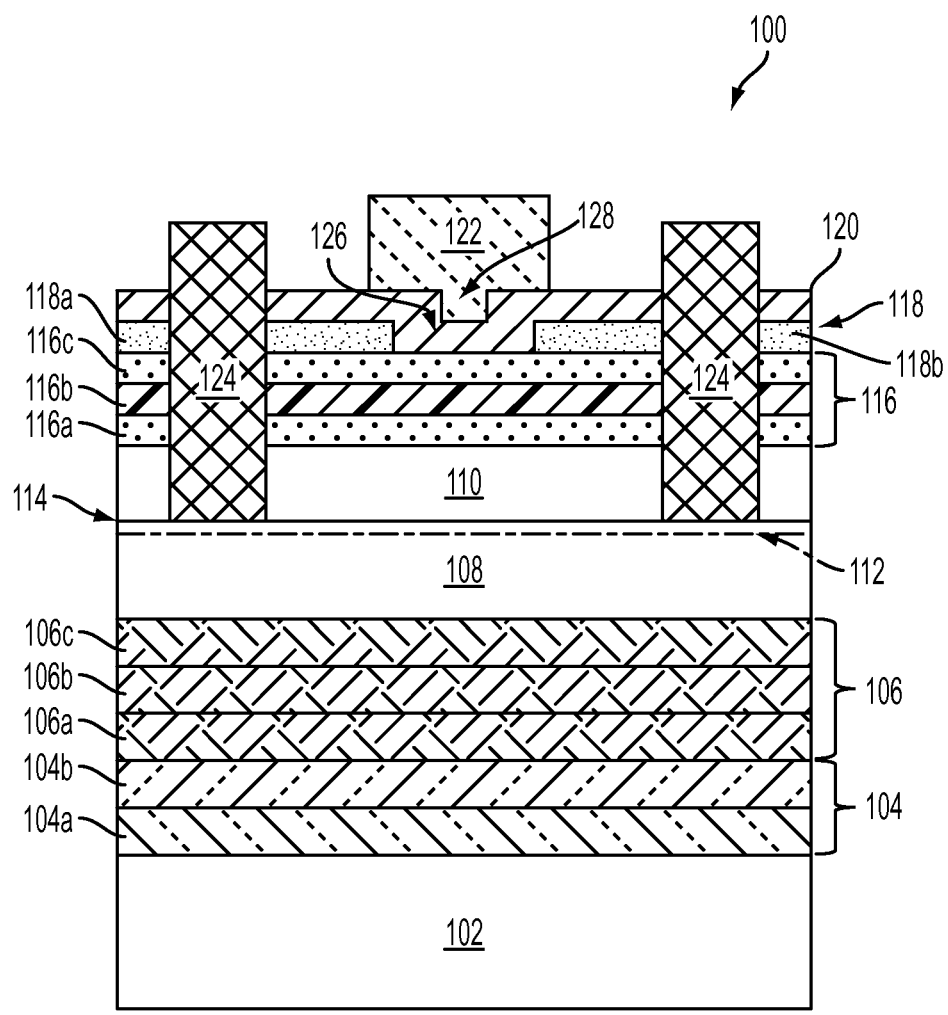
FIG. 1 is a cross-sectional view of a high electron mobility transistor (HEMT) in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms concerning attachments, coupling and the like, such as "connected" and "interconnected," refer to a relationship wherein components are attached to one another either directly or indirectly through intervening components, unless expressly described otherwise.

FIG. 1 is a cross-sectional view of a high electron mobility transistor (HEMT) 100 in accordance with one or more embodiments. HEMT 100 includes a substrate 102. A buffer layer 104 is over substrate 102. In some embodiments, buffer layer 104 includes one or more layers. A graded layer 106 is over buffer layer 104. In some embodiments, graded layer 106 includes one or more layers. A channel layer 108 is over graded layer 106. An active layer 110 is over channel layer 108. Due to a band gap discontinuity between channel layer 108 and active layer 110, a two-dimensional electron gas (2-DEG) 112 is formed in the channel layer 108 near an interface 114 with the active layer 110. Electrodes 124 are over channel layer 108. Laminate layer 116 is over active layer 110. In some embodiments, laminate layer 116 includes multiple layers. Passivation layer 118 is over laminate layer 116. Dielectric layer 120 is over passivation layer 118. In some embodiments, electrodes 124 extend through one or more of the dielectric layer 120, passivation layer 118, laminate layer 116 or the active layer 110. Gate 122 is over the active layer 110 and is also between the electrodes 124.

Substrate 102 acts as a support for HEMT 100. In some embodiments, substrate 102 is a silicon substrate. In some embodiments, substrate 102 includes silicon carbide (SiC), sapphire, silicon or another suitable substrate material. In some embodiments, substrate 102 is a silicon substrate having a (111) lattice orientation. In some embodiments, substrate 102 is a bulk substrate formed of a bulk material. In some embodiments, substrate 102 is a composite substrate comprising a plurality of layers that are formed of different materials. In some embodiments, substrate 102 is doped.

In some embodiments, substrate 102 is doped with p-type dopants. In some embodiments, the p-type dopants include boron, aluminum, gallium, indium, titanium, boron di-fluoride, combinations thereof, or other suitable p-type dopants. The dopant concentration ranges from about $1 \times 10^{18}$ ions/$cm^3$ to about $1 \times 10^{23}$ ions/$cm^3$. In some embodiments, the p-type dopants are implanted using an ion implantation process to implant dopants directly into substrate 102. In some embodiments, the p-type dopants are introduced using a plasma enhanced chemical vapor etching (PECVE) process, a reactive ion etching (RIE) process, a ion implantation (IMP) or another suitable material removal process to remove a top portion of substrate 102 and then a doped layer is grown over the remaining portion of the substrate. In some embodiments, an anneal process is performed following the introduction of the p-type dopants. In some embodiments, the anneal process is performed at a temperature ranging from about 900° C. to about 1100° C., for a duration of up to 60 minutes. The introduction of the p-type dopants helps to reduce a concentration of electrons present at a top surface of the substrate. The lower electron concentration enables a higher voltage to be applied to gate 116 without damaging HEMT 100. As a result, HEMT 100 is able to be used in higher voltage applications in comparison with HEMTs which do not include substrate 102 having a doped top surface, as described above.

Buffer layer 104 is formed over substrate 102. In some embodiments, buffer layer 104 acts as a transition layer for subsequently formed overlying layers. In some embodiments, buffer layer 104 reduces lattice mismatch between substrate 102 and graded layer 106. In some embodiments, buffer layer 104 is formed by epitaxially growing the buffer layer on substrate 102. In some embodiments, buffer layer 104 is formed using molecular oriented chemical vapor deposition (MOCVD), molecular beam epitaxy (MBE), hydride vapour phase epitaxy (HVPE), atomic layer deposition (ALD), physical vapor deposition (PVD) or another suitable formation process.

In some embodiments, buffer layer 104 includes a single layer. In some embodiments, buffer layer 104 includes an aluminum nitride (AlN) layer having a thickness in a range between about 10 nanometers (nm) and about 300 nm. In some embodiments, buffer layer 104 includes multiple layers (e.g., first buffer layer 104a and second buffer layer 104b). In some embodiments, buffer layer 104 comprises a first buffer layer 104a on substrate 102 and a second buffer layer 104b on the first buffer layer 104a. In some embodiments, each of first buffer layer 104a and second buffer layer 104b include a same material formed at different temperatures. In some embodiments, each of first buffer layer 104a and second buffer layer 104b include a step-wise change in lattice structure. In some embodiments, each of first buffer layer 104a and second buffer layer 104b include a continuous change in lattice structure. In some embodiments, buffer layer 104 includes a first buffer layer 104a (e.g., low-temperature AlN layer formed at a temperature between about 800° C. and about 1,200° C.) and a second buffer layer 104b (e.g., high-temperature AlN layer formed at a temperature between about 1,000° C. and about 1,400° C.). The lower temperature provides a different lattice structure in the second AlN layer in comparison with the first AlN layer. In some embodiments, first buffer layer 104a has a thickness ranging from about 10 nanometers (nm) to about 100 nm. In some embodiments, second buffer layer 104b has a thickness ranging from about 100 nm to about 200 nm.

Graded layer 106 is formed over buffer layer 104. In some embodiments, graded layer 106 provides additional lattice matching between buffer layer 104 and channel layer 108. In some embodiments, graded layer 106 comprises one or more layers. In some embodiments, graded layer 106 comprises a first graded layer 106a on buffer layer 104, a second graded layer 106b on the first graded layer 104a and a third graded layer 106c on the second graded layer 104b.

In some embodiments, graded layer 106 is epitaxially grown using metalorganic vapour phase epitaxy (MOVPE). In some embodiments, graded layer 106 has a thickness ranging from about 500 nm to about 1050 nm. In some embodiments, the graded layer 106 is formed at a temperature ranging from about 1000° C. to about 1200° C. In some embodiments, graded layer 106 includes a single layer. In some embodiments, graded layer 106 includes aluminum gallium nitride ($Al_xGa_{1-x}N$), where x is the aluminum content ratio in the graded layer 106. In some embodiments, graded layer 106 includes multiple layers (first graded layer 106a, second graded layer 106b and third graded layer 106c), each having a decreased ratio x (from a layer adjoining buffer layer 104 to a layer that adjoins channel layer 108, or from the bottom to the top portions of the graded layer 106). In some embodiments, graded layer 106 is a graded layer such that the relative amounts of the respective aluminum or gallium content change with depth in the graded layer 106. In some embodiments, the relative amounts of the respective aluminum or gallium content gradually change to reduce the lattice parameter.

In at least one example, graded layer 106 includes three graded layers (e.g., first graded layer 106a, second graded layer 106b and third graded layer 106c). The first graded layer 106a adjoins buffer layer 104. In some embodiments, the first graded layer 106a includes $Al_xGa_{1-x}N$, where x ranges from about 0.65 to about 0.9. In some embodiments, a thickness of the first graded layer 106a ranges from about 50 nm to about 200 nm. A second graded layer 106b is on the first graded layer 106a. In some embodiments, the second graded layer 106b includes $Al_xGa_{1-x}N$, where x ranges from about 0.35 to about 0.6. In some embodiments, a thickness of the second graded layer 106b ranges from about 150 nm to about 250 nm. A third graded layer 106c is on the second graded layer 106b. In some embodiments, the third graded layer 106c includes $Al_xGa_{1-x}N$, where x ranges from about 0.1 to about 0.3. In some embodiments, a thickness of the third graded layer 106c ranges from about 350 nm to about 600 nm.

In some embodiments, graded layer 106 is doped with p-type dopants to reduce the risk of electron injection from substrate 102. Electron injection occurs when electrons from substrate 102 diffuse into channel layer 108. By including p-type dopants, the electrons are trapped by the positively charged dopants and do not negatively impact performance of 2-DEG 112 in channel layer 108. In some embodiments, the p-type dopant concentration in graded layer 106 is greater than or equal to $1 \times 10^{17}$ ions/cm$^3$. In some embodiments, the p-type dopants include carbon, iron, magnesium, zinc or other suitable p-type dopants. In some embodiments, a p-type dopant concentration of graded layer 106 increases from a bottom of the graded layer to a top of the graded layer.

Channel layer 108 is formed over graded layer 106. In some embodiments, channel layer 108 is used to help form a conductive path for selectively connecting electrodes 124. In some embodiments, channel layer 108 has a thickness ranging from about 0.1 μm to about 10.0 μm. In some embodiments, channel layer 108 comprises a layer of a III-V compound. In some embodiments, channel layer 108 includes gallium nitride (GaN). In some embodiments, channel layer 108 is undoped. In some embodiments, channel layer 108 is unintentionally doped; for example, lightly doped with n-type dopants due to a precursor used for forming channel layer 108, but with no dopant that causes the channel layer 108 to be n-type or p-type intentionally added.

In some embodiments, an epitaxial process forms channel layer 108. In some embodiments, channel layer 108 is epitaxially grown using MOVPE, during which a gallium-containing precursor and a nitrogen-containing precursor are used. In some embodiments, the gallium-containing precursor includes one or more of trimethylgallium (TMG), triethylgallium (TEG), or other suitable gallium-containing chemicals. In some embodiments, the nitrogen-containing precursor includes one or more of ammonia ($NH_3$), tertiarybutylamine (TBAm), phenyl hydrazine, or other suitable chemicals. In some embodiments, channel layer 108 is formed at a temperature ranging from about 1000° C. to about 1200° C.

Active layer 110 is formed over channel layer 108. In some embodiments, active layer 110 is used to provide a band gap discontinuity with the channel layer 108 to form two-dimensional electron gas (2-DEG) 112. In some embodiments, the band gap of the active layer 110 is greater than the band gap of the channel layer 108. In some embodiments, the active layer 110 has a thickness ranging from about 3 nm to about 50 nm. In some embodiments, active layer 110 comprises a layer of a III-V compound. In some embodiments, the active layer 110 comprises AlGaN. In some embodiments, active layer 110 includes AlN. In some embodiments, active layer 110 includes a mixed structure, e.g., $Al_xGa_{1-x}N$, where x ranges from about 0.1 to 0.3. In some embodiments where active layer 110 includes an AlN layer and a mixed structure layer, a thickness of the AlN layer ranges from about 0.5 nm to about 1.5 nm. In some embodiments, the active layer 110 comprises $In_xAl_yGa_zN$ (with x+y+z=1, and 0≤x, y, and z≤1), or the like.

In some embodiments, an epitaxial process forms active layer 110. In some embodiments, active layer 110 is epitaxially grown using MOVPE. In some embodiments, if the active layer 110 is formed of AlGaN, the active layer 110 is grown using one or more of an aluminum-containing precursor, a gallium-containing precursor, or a nitrogen-containing precursor. In some embodiments, the aluminum-containing precursor includes one or more of trimethylaluminum (TMA), triethylaluminium (TEA), or other suitable chemicals. In some embodiments, the gallium-containing precursor and the nitrogen-containing precursor are selected from the same candidate precursors used for forming channel layer 108. In some embodiments, active layer 110 is formed at a temperature ranging from about 1000° C. to about 1200° C. In some embodiments, active layer 110 is formed on channel layer 108.

2DEG 112 is formed in channel layer 108 near an interface 114. Interface 114 is the interface between the channel layer 108 and the active layer 110. In some embodiments, 2-DEG 112 acts as the channel for providing conductivity between electrodes 124. Electrons from a polarization (spontaneous and/or piezoelectric) effect in active layer 110 drop into channel layer 108, and thus create a thin layer of highly mobile conducting electrons in the channel layer.

Laminate layer 116 is formed over the active layer 110. In some embodiments, laminate layer 116 includes multiple layers. In some embodiments, laminate layer 116 comprises a first crystalline layer 116a, a blocking layer 116b and a second crystalline layer 116c. In some embodiments, a thickness of the laminate layer 116 ranges from about 9 Å to about 110 Å. In some embodiments, the laminate layer 116 is formed between electrodes 124. In some embodiments, the width W2 of the laminate layer 116 is substantially equal to the width W1 of the active layer 110 (shown in FIGS. 3D and 3E). In some embodiments, the width W2 of the laminate layer 116 is substantially equal to the width W3 of the gate 122 (shown in FIG. 3H). In some embodiments, the width W2 of the laminate layer 116 is less than the width W3 of the gate 122 (shown in FIGS. 3E and 3H). In some embodiments, second crystalline layer 116c is optional. In some embodiments, the laminate layer 116 comprises an alternating sequence of one or more blocking layers 116b and one or more second crystalline layers 116c, both formed over the first crystalline layer 116a. In some embodiments, one or more of the gate 122, the dielectric layer 120 or the laminate layer 116 are co-terminus, with the edges of the laminate layer 116 aligned with the respective edges of the gate 122 or the dielectric layer 120.

First crystalline layer 116a is formed over active layer 110. In some embodiments, first crystalline layer 116a is formed on the top surface of the active layer 110. In some embodiments, the bottom surface of the first crystalline layer 116a is substantially flush with the top surface of the active layer 110. In some embodiments, first crystalline layer 116a is a single crystalline structure. In some embodiments, first crystalline layer 116a is a polycrystalline structure. In some embodiments, the band gap of the first crystalline layer 116a is greater than the band gap of the channel layer 108 (e.g., such as GaN). In some embodiments, the band gap of the first crystalline layer 116a is greater than the band gaps of both the active layer 110 (e.g., such as AlGaN) and the channel layer 108. In some embodiments, first crystalline layer 116a comprises a dielectric material. In some embodiments, first crystalline layer 116a comprises a dielectric material selected from $SiN_x$, $SiO_x$, $Al_2O_3$, $MgO$, $Ga_2O_3$, $La_2O_3$, $HfO_2$, $ZrO_2$, $Y_2O_3$, $Gd_2O_3$, $Ce_2O_3$, $Ta_2O_3$, $Ta_2O_5$, or any combinations thereof, and multi-layers thereof. In some embodiments, first crystalline layer 116a comprises a semiconductor material with a relatively high resistivity and a relatively high band gap. In some embodiments, the first crystalline layer 116a comprises a semiconductor material selected from AlN, $In_xAl_yGa_zN$ (with x+y+z=1, and 0≤x, y, and z≤1), or the like. In some embodiments, a thickness of the first crystalline layer 116a ranges from about 3 Å to about 10 Å.

In some embodiments, the process conditions for forming the first crystalline layer 116a include a deposition temperature ranging from about 500° C. or higher. In some embodiments, first crystalline layer 116a is formed using MOCVD, ALD, PVD, MBE, pulsed laser deposition (PLD) or the like. In some embodiments, the process conditions for forming first crystalline layer 116a are controlled, such that the first crystalline layer 116a has a good crystalline structure with a single-crystalline structure or at least a poly-crystalline structure. In some embodiments, if the first crystalline layer 116a has a good crystalline structure (i.e., a single-crystalline structure or at least a poly-crystalline structure), the bonding between the atoms of the first crystalline layer 116a is strong and the Interfacial Density of States (Dit) at the interface between the first crystalline layer 116a and the active layer 110 is low.

In some embodiments, the first crystalline layer 116a is formed in-situ with the formation of the active layer 110; e.g., in a same process chamber with no vacuum break occurring between the formation of the active layer 110 and the formation of the first crystalline layer 116a. In some embodiments, the first crystalline layer 116a is formed ex-situ with the formation of the active layer 110; e.g., in different process chambers. In some embodiments, the first crystalline layer 116a is formed as a crystalline layer. In some embodiments, the first crystalline layer 116a is formed as a poly-crystalline layer and is subsequently re-crystallized through a high-temperature annealing. In some embodiments, the high-temperature annealing is performed with an annealing temperature greater than the re-crystallization temperature of the poly-crystalline layer. For example, the re-crystallization temperature depends on the formed layer and is higher than 550° C. for $HfO_2$.

Blocking layer 116b is formed over first crystalline layer 116a. In some embodiments, blocking layer 116b is formed on a top surface of the first crystalline layer 116a. In some embodiments, the bottom surface of the blocking layer 116b is substantially flush with the top surface of the first crystalline layer 116a. In some embodiments, blocking layer 116b is an amorphous structure which can break off the polarization effect induced from first crystalline layer 116a. In some embodiments, blocking layer 116b comprises a dielectric material. In some embodiments, blocking layer 116b comprises a dielectric material selected from $AlO_x$, $SiN_x$, $SiO_x$, MgO, $Ga_2O_3$, $La_2O_3$, $HfO_2$, $ZrO_2$, $Y_2O_3$, $Gd_2O_3$, $Ce_2O_3$, $Ta_2O_3$, or any combinations thereof, and multi-layers thereof. In some embodiments, a thickness of the blocking layer 116b ranges from about 3 Å to about 50 Å.

In some embodiments, blocking layer 116b is formed using MOCVD, ALD, PVD, MBE, PLD or the like. In some embodiments, the blocking layer 116b is formed in-situ with the formation of the first crystalline layer 116a; e.g., in a same process chamber with no vacuum break occurring between the formation of the first crystalline layer 116a and the formation of the blocking layer 116b. In some embodiments, the blocking layer 116b is formed ex-situ with the formation of the first crystalline layer 116a; e.g., in different process chambers. In some embodiments, blocking layer 116b is formed as an amorphous layer. In some embodiments, blocking layer 116b remains an amorphous phase even with high-temperature annealing which is performed with an annealing temperature lower than re-crystallization temperature of the blocking layer 116b. For example, the re-crystallization temperature depends on the formed layer and is lower than 800° C. for $Al_2O_3$.

The use of the blocking layer 116b over the first crystalline layer 116a yields a HEMT 100 with a small threshold voltage (Vt) shift. In some embodiments, a small threshold voltage (Vt) shift yields an improved HEMT device. In some embodiments, the first crystalline layer 116a is re-crystallized from one or more processes performed after the deposition of the first crystalline layer 116a. In some embodiments, the re-crystallization of the first crystalline layer 116a yields polarization effects which induce a lower threshold voltage (Vt) for a HEMT. In some embodiments, the blocking layer 116b reduces the polarization effect of the first crystalline layer 116a and mitigates the Vt shift in HEMT 100.

Second crystalline layer 116c is formed over blocking layer 116b. In some embodiments, the second crystalline layer 116c is formed on the top surface of the blocking layer 116b. In some embodiments, the bottom surface of the second crystalline layer 116c is substantially flush with the top surface of the blocking layer 116b. In some embodiments, second crystalline layer 116c is a single crystalline structure. In some embodiments, second crystalline layer 116c is a polycrystalline structure. In some embodiments, the band gap of the second crystalline layer 116c is greater than the band gap of the channel layer 108 (e.g., such as GaN). In some embodiments, the band gap of the second crystalline layer 116c is greater than the band gaps of both the active layer 110 (e.g., such as AlGaN) and the channel layer 108. In some embodiments, second crystalline layer 116c comprises a dielectric material. In some embodiments, second crystalline layer 116c comprises a dielectric material selected from $SiN_x$, $SiO_x$, $Al_2O_3$, MgO, $Ga_2O_3$, $La_2O_3$, $HfO_2$, $ZrO_2$, $Y_2O_3$, $Gd_2O_3$, $Ce_2O_3$, $Ta_2O_3$, $Ta_2O_5$, or any combinations thereof, and multi-layers thereof. In some embodiments, second crystalline layer 116c comprises a semiconductor material with a relatively high resistivity and a relatively high band gap. In some embodiments, the second crystalline layer 116c comprises a semiconductor material selected from AlN, $In_xAl_yGa_zN$ (with x+y+z=1, and 0≤x, y, and z≤1), or the like. In some embodiments, a thickness of the second crystalline layer 116c ranges from about 3 Å to about 50 Å.

In some embodiments, second crystalline layer 116c is formed using MOCVD, ALD, PVD, MBE, PLD, or the like.

In some embodiments, the second crystalline layer 116c is formed in-situ with the formation of the blocking layer 116b; e.g., in a same process chamber with no vacuum break occurring between the formation of the blocking layer 116b and the formation of the second crystalline layer 116c. In some embodiments, the second crystalline layer 116c is formed ex-situ with the formation of the blocking layer 116b; e.g., in different process chambers. In some embodiments, the second crystalline layer 116c is formed as a crystalline layer. In some embodiments, the second crystalline layer 116c is formed as a poly-crystalline layer and is subsequently re-crystallized through a high-temperature annealing. In some embodiments, the high-temperature annealing is performed with an annealing temperature greater than the re-crystallization temperature of the poly-crystalline layer. For example, the re-crystallization temperature depends on the formed layer and is higher than 550° C. for $HfO_2$.

Passivation layer 118 is formed over laminate layer 116. In some embodiments, passivation layer 118 protects the underlying laminate layer 116 or the active layer 110 from plasma damage (i.e., during the formation of dielectric layer 120). In some embodiments, the passivation layer 118 comprises a first passivation portion 118a and a second passivation portion 118b. In some embodiments, the first passivation portion 118a and the second passivation portion 118b are separated by a first recess 126. In some embodiments, the first recess 126 is below the gate 122. In some embodiments, the bottom surface of the passivation layer 118 is formed on a top surface of laminate layer 116. First recess 126 exposes a portion of the top surface of laminate layer 116 to the upper layers.

In some embodiments, passivation layer 118 has a thickness ranging from about 100 Å to about 5,000 Å. In some embodiments, passivation layer 118 comprises a dielectric material selected from $SiO_x$ or $SiN_x$, or any combinations thereof, and multi-layers thereof. In some embodiments, the passivation layer 118 comprises $SiN_x$, where x ranges from about 0.5 to about 1.33. In some embodiments, the passivation layer 118 comprises $SiO_x$, where x ranges from about 0.5 to about 2.1. In some embodiments, if the passivation layer 118 comprises $SiN_x$, the passivation layer 118 is formed by performing a Low-Pressure Chemical Vapor Deposition (LPCVD) method (without plasma) using $SiH_4$ and $NH_3$ gases.

A dielectric layer 120 is formed over the laminate layer 116. In some embodiments, a portion of the dielectric layer 120 is formed over the passivation layer 118. In some embodiments, a portion of the dielectric layer 120 is formed in the first recess 126. In some embodiments, a portion of the dielectric layer 120 is formed on the top surface of the laminate layer 116. In some embodiments, a second recess 128 is formed in a central portion of the dielectric layer 120. In some embodiments, dielectric layer 120 reduces a leakage current from the gate electrode 122 to the active layer 110. In some embodiments, the HEMT 100 is operated under high operation voltages for various applications. In some embodiments, dielectric layer 120 is optional. For example, dielectric layer 120 is optional where the gate 122 is in direct contact with laminate layer 116. In some embodiments, where dielectric layer 120 is utilized, HEMT 100 comprises a Depletion-mode Metal Insulating Semiconductor Field Effect Transistor D-MISFET.

In some embodiments, dielectric layer 120 has a thickness ranging from about 3 nm to about 50 nm. In some embodiments, dielectric layer 120 comprises a dielectric material selected from $SiN_x$, $SiO_x$, $Al_2O_3$, $Sc_2O_3$, $Ga_2O_3$, $La_2O_3$, $HfO_2$, $ZrO_2$, or any combinations thereof, and multi-layers thereof. In some embodiments, dielectric layer 120 has an amorphous structure in order to reduce the leakage current flowing through dielectric layer 120. In some embodiments, dielectric layer 120 is formed using ALD, Plasma Enhanced Chemical Vapor Deposition (PECVD) or LPCVD. In some embodiments, dielectric layer 120 is formed in an amorphous or non-crystallization structure.

Gate 122 is formed over dielectric layer 120. In some embodiments, gate 122 helps to modulate conductivity of 2-DEG 112 for transferring a signal between electrodes 124. In some embodiments, a portion of the gate 122 extends into second recess 128. In some embodiments, a portion of the gate 122 overlaps a portion of the passivation layer 118 or a portion of the dielectric layer 120. In some embodiments, dielectric layer 120 separates gate 122 from passivation layer 118 or laminate layer 116. In some embodiments, the formation of the gate 122 includes depositing a blanket gate electrode layer over dielectric layer 120, filling the second recess 128 and performing lithography and etching processes on the gate electrode layer to define gate 122. In some embodiments, gate 122 comprises a conductive material including one or more refractory metals or respective compounds, including titanium (Ti), titanium nitride (TiN), titanium tungsten (TiW), Tantalum (Ta), Tantalum nitride (TaN), and tungsten (W). In some embodiments, gate 122 comprises nickel (Ni), gold (Au), copper (Cu), or any alloys thereof. In some embodiments, gate 122 is between a first electrode and a second electrode, wherein the gate is configured to control a conductivity of the 2-DEG between the first electrode and the second electrode.

Electrodes 124 are formed on the active layer 110. In some embodiments, electrodes 124 act as a source and a drain for HEMT 100 for transferring a signal into or out of the HEMT 100. In some embodiments, electrodes 124 are formed on the opposite sides of the gate 122. In some embodiments, the electrodes 124 extend through one or more of the dielectric layer 120, passivation layer 118, laminate layer 116 or active layer 110. In some embodiments, when a voltage is applied to gate 122, HEMT 100 modulates a device current. In some embodiments, electrodes 122 include one or more conductive materials. In some embodiments, electrodes 122 comprise one or more of Ti, Co, Ni, W, Pt, Ta, Pd, Mo, Al, TiN, AlCu alloy, or alloys thereof.

Figure 2:
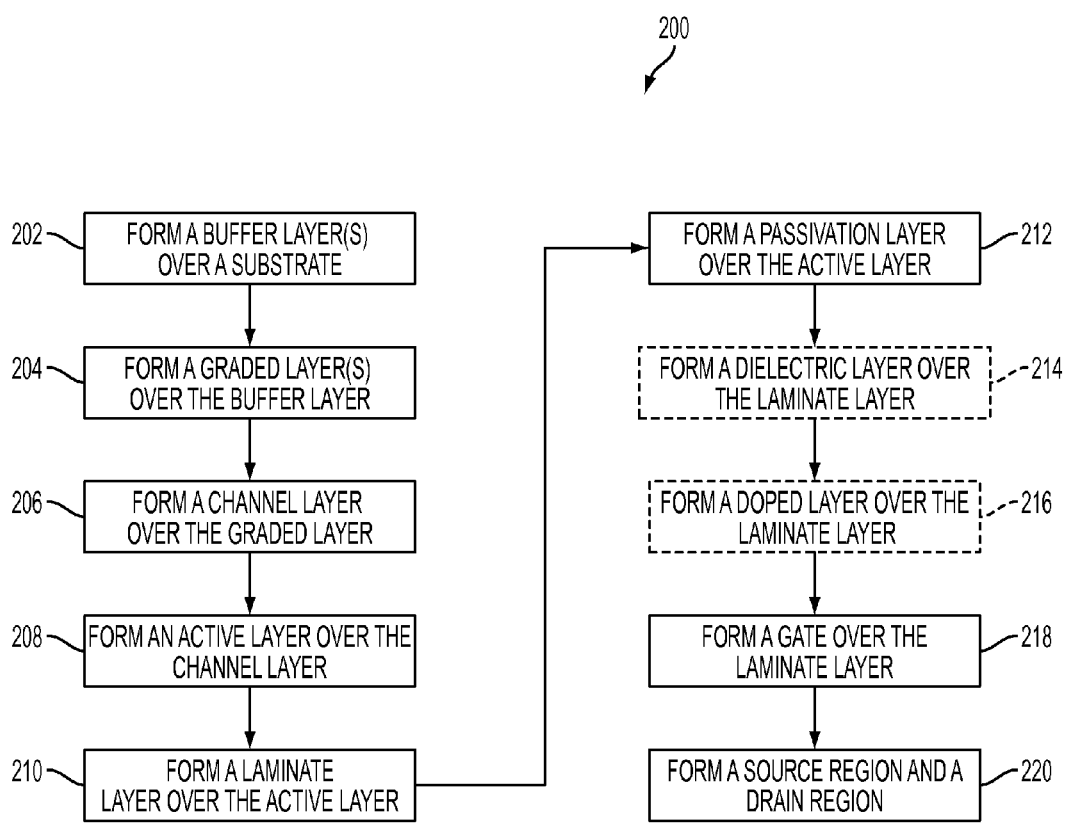
FIG. 2 is a flow chart of a method of making an HEMT in accordance with one or more embodiments.

FIG. 2 is a flow chart of a method 200 of making an HEMT in accordance with one or more embodiments. Method 200 begins with operation 202 in which a buffer layer, e.g., buffer layer 104, is formed on a substrate, e.g., substrate 102. In some embodiments, the buffer layer is formed by epitaxially growing the buffer layer on the substrate. In some embodiments, the buffer layer is formed using MOCVD, MBE, HYPE, ALD, PVD or another suitable formation process. In some embodiments, the buffer layer includes a low-temperature buffer layer (e.g., low-temperature AlN layer formed at a temperature between about 800° C. and about 1,200° C.) and a high-temperature buffer layer (e.g., high-temperature AlN layer formed at a temperature between about 1,000° C. and about 1,400° C.).

In operation 204, a graded layer, e.g., graded layer 106, is formed on the buffer layer, e.g., buffer layer 104. In some embodiments, the graded layer includes an aluminum-gallium nitride ($Al_xGa_{1-x}N$) layer. In some embodiments, the graded aluminum gallium nitride layer has two or more aluminum-gallium nitride layers each having a different ratio x decreased from the bottom to the top. In some embodiments, each of the two or more aluminum-gallium nitride layers is formed by performing an epitaxial process. In some embodiments, the epitaxial process includes a MOCVD process, a MBE process, a HVPE process or another suitable epitaxial process. In some embodiments, the MOCVD process uses an aluminum-containing precursor, a gallium-containing precursor, and a nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical.

In some embodiments, the graded layer has a thickness ranging from about 500 nm to about 1050 nm. In some embodiments, the graded layer is formed at a temperature ranging from about 1000° C. to about 1200° C. In some embodiments, graded layer 106 includes three graded layers (first graded layer, e.g., first graded layer 106a, second graded layer, e.g., second graded layer 106b and third graded layer, e.g., third graded layer 106c). In some embodiments, the first graded layer includes $Al_xGa_{1-x}N$, where x ranges from about 0.65 to about 0.9. In some embodiments, a thickness of the first graded layer ranges from about 50 nm to about 200 nm. In some embodiments, the second graded layer includes $Al_xGa_{1-x}N$, where x ranges from about 0.35 to about 0.6. In some embodiments, a thickness of the second graded layer ranges from about 150 nm to about 250 nm. In some embodiments, the third graded layer includes $Al_xGa_{1-x}N$, where x ranges from about 0.1 to about 0.3. In some embodiments, a thickness of the third graded layer ranges from about 350 nm to about 600 nm.

Method 200 continues with operation 206 in which a channel layer, e.g., channel layer 108, is formed on the graded layer, e.g., graded layer 106. In some embodiments, the channel layer includes GaN. In some embodiments, the channel layer includes p-type dopants implemented by using dopants including carbon, iron, magnesium, zinc or other suitable p-type dopants. In some embodiments, performing an epitaxial process forms the channel layer. In some embodiments, the epitaxial process includes using MOVPE, during which a gallium-containing precursor and a nitrogen-containing precursor are used. In some embodiments, the gallium-containing precursor includes one or more of trimethylgallium (TMG), triethylgallium (TEG), or other suitable gallium-containing chemicals. In some embodiments, the nitrogen-containing precursor includes one or more of ammonia ($NH_3$), tertiarybutylamine (TBAm), phenyl hydrazine, or other suitable chemicals. In some embodiments, channel layer 108 is formed at a temperature ranging from about 1000° C. to about 1200° C.

In operation 208, an active layer, e.g., active layer 110, is formed on the channel layer, e.g., channel layer 108. In some embodiments, the active layer includes AlN, $Al_xGa_{1-x}N$, combinations thereof or other suitable materials. In some embodiments, x ranges from about 0.1 to about 0.3. In some embodiments, performing an epitaxial process forms the active layer. In some embodiments, the epitaxial process includes using MOVPE. In some embodiments, if the active layer is formed of AlGaN, the active layer is grown using one or more of an aluminum-containing precursor, a gallium-containing precursor, or a nitrogen-containing precursor. In some embodiments, the aluminum-containing precursor includes one or more of trimethylaluminum (TMA), triethylaluminium (TEA), or other suitable chemicals. In some embodiments, the gallium-containing precursor and the nitrogen-containing precursor are selected from the same candidate precursors used for forming channel layer. In some embodiments, active layer is formed at a temperature ranging from about 1000° C. to about 1200° C.

In operation 210, a laminate layer, e.g., laminate layer 116, is formed over the active layer, e.g., active layer 110. In some embodiments, the laminate layer includes multiple layers (e.g., a first crystalline layer, a blocking layer and a second crystalline layer). In some embodiments, laminate layer 116 comprises a first crystalline layer, e.g., first crystalline layer 116a, a blocking layer, e.g., blocking layer 116b and a second crystalline layer, e.g., second crystalline layer 116c. In some embodiments, a thickness of the laminate layer ranges from about 9 Å to about 110 Å.

In some embodiments, at least one of first crystalline layer or second crystalline layer is a single crystalline structure. In some embodiments, at least one of first crystalline layer or second crystalline layer is a polycrystalline structure. In some embodiments, first crystalline layer or second crystalline layer comprises a dielectric material. In some embodiments, first crystalline layer or second crystalline layer comprises a dielectric material selected from $SiN_x$, $SiO_x$, $Al_2O_3$, MgO, $Ga_2O_3$, $La_2O_3$, $HfO_2$, $ZrO_2$, $Y_2O_3$, $Gd_2O_3$, $Ce_2O_3$, $Ta_2O_3$, $Ta_2O_5$, or any combinations thereof, and multi-layers thereof. In some embodiments, first crystalline layer or second crystalline layer comprises a semiconductor material with a relatively high resistivity and a relatively high band gap. In some embodiments, the first crystalline layer or second crystalline layer comprises a semiconductor material selected from AlN, $In_xAl_yGa_zN$ (with $x+y+z=1$, and $0 \leq x, y,$ and $z \leq 1$), or the like. In some embodiments, a thickness of the first crystalline layer ranges from about 3 Å to about 10 Å. In some embodiments, a thickness of the second crystalline layer ranges from about 3 Å to about 50 Å.

In some embodiments, the process conditions for forming the first crystalline layer or second crystalline layer include a deposition temperature ranging from about 500° C. or higher. In some embodiments, first crystalline layer or second crystalline layer is formed using MOCVD, ALD, PVD, MBE, PLD or the like. In some embodiments, the process conditions for forming first crystalline layer or second crystalline layer are controlled, such that the first crystalline layer or second crystalline layer has a good crystalline structure with a single-crystalline structure or at least a poly-crystalline structure. In some embodiments, if the first crystalline layer or second crystalline layer has a good crystalline structure (i.e., a single-crystalline structure or at least a poly-crystalline structure), the bonding between the atoms of the first crystalline layer is strong and the Interfacial Density of States (Dit) at the interface between the first crystalline layer and the active layer is low.

In some embodiments, the first crystalline layer or second crystalline layer is formed in-situ with the formation of the active layer; e.g., in a same process chamber with no vacuum break occurring between the formation of the active layer and the formation of the first crystalline layer or second crystalline layer. In some embodiments, the first crystalline layer or second crystalline layer is formed ex-situ with the formation of the active layer; e.g., in different process chambers. In some embodiments, the first crystalline layer or second crystalline layer is formed as a crystalline layer. In some embodiments, the first crystalline layer or second crystalline layer is formed as a poly-crystalline layer and is subsequently re-crystallized through a high-temperature annealing. In some embodiments, the high-temperature annealing is performed with an annealing temperature greater than the re-crystallization temperature of the poly-crystalline layer. For example, the re-crystallization temperature depends on the formed layer and is higher than 550° C. for $HfO_2$.

In some embodiments, the blocking layer is an amorphous structure which can break off the polarization effect induced from the first crystalline layer. In some embodiments, the blocking layer comprises a dielectric material selected from $AlO_x$, $SiN_g$, $SiO_x$, MgO, $Ga_2O_3$, $La_2O_3$, $HfO_2$, $ZrO_2$, $Y_2O_3$, $Gd_2O_3$, $Ce_2O_3$, $Ta_2O_3$, or any combinations thereof, and multi-layers thereof. In some embodiments, a thickness of the blocking layer ranges from about 3 Å to about 50 Å.

In some embodiments, the blocking layer is formed using MOCVD, ALD, PVD, MBE, PLD, or the like. In some embodiments, the blocking layer is formed in-situ with the formation of the first crystalline layer; e.g., in a same process chamber with no vacuum break occurring between the formation of the first crystalline layer and the formation of the blocking layer. In some embodiments, the blocking layer is formed ex-situ with the formation of the first crystalline layer; e.g., in different process chambers. In some embodiments, the blocking layer is formed as an amorphous layer. In some embodiments, the blocking layer remains an amorphous phase even with high-temperature annealing which is performed with an annealing temperature lower than the re-crystallization temperature of the blocking layer. For example, the re-crystallization temperature depends on the formed layer and is lower than 800° C. for $Al_2O_3$.

Figure 4:
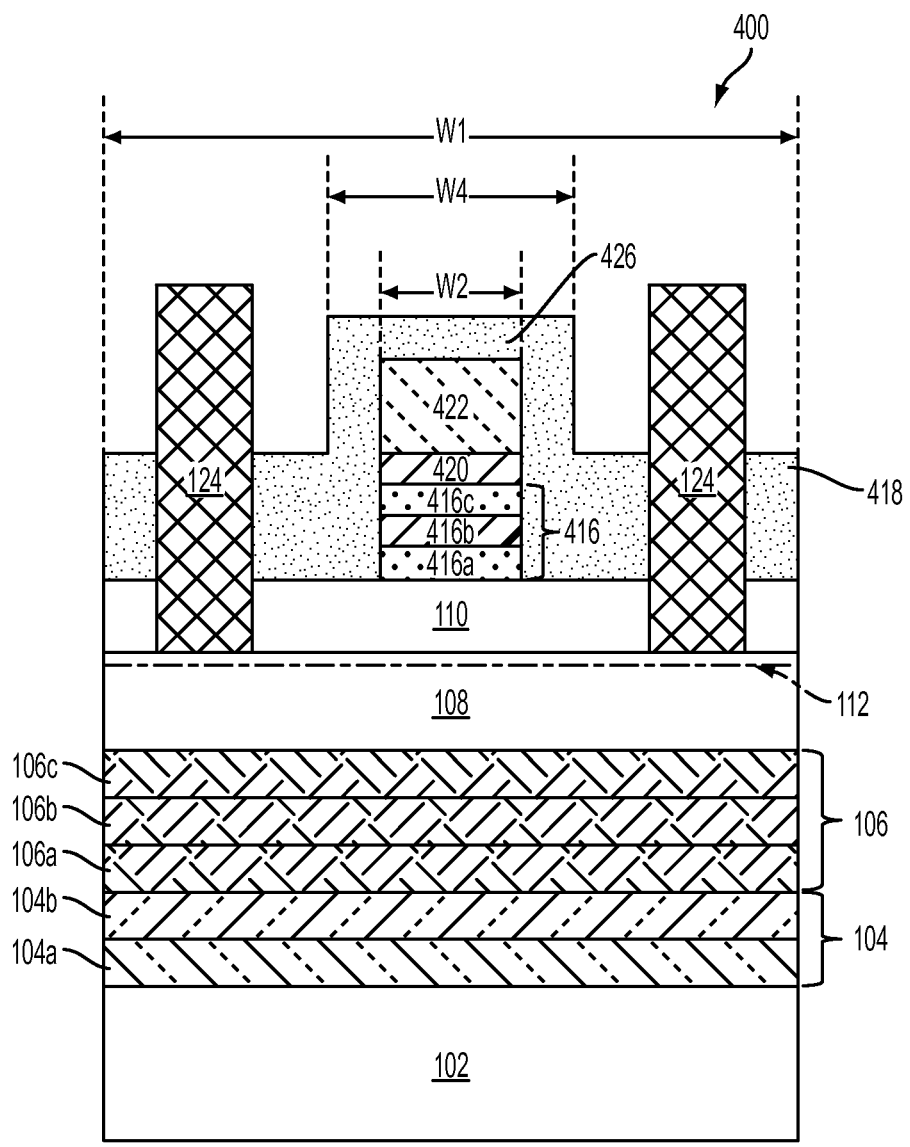
FIG. 4 is a cross-sectional view of a HEMT in accordance with one or more embodiments.

Method 200 continues with operation 212 in which a passivation layer, e.g., passivation layer 118, is formed over the active layer, e.g., active layer 110 (as shown in FIG. 1, FIG. 4 and FIGS. 5-8). In some embodiments, at least a portion of the passivation layer is formed over the laminate layer, e.g., laminate layer 116 (as shown in FIG. 1 and FIG. 4). In some embodiments, the passivation layer has a thickness ranging from about 100 Å to about 5,000 Å. In some embodiments, the passivation layer comprises a dielectric material selected from $SiO_x$ or $SiN_x$, or any combinations thereof, and multi-layers thereof. In some embodiments, the passivation layer is formed using CVD, spin-on polymeric dielectric or other suitable formation processes. In some embodiments, if the passivation layer comprises $SiN_x$, the passivation layer is formed by performing a Low-Pressure Chemical Vapor Deposition (LPCVD) method (without plasma) using $SiH_4$ and $NH_3$ gases. In some embodiments, if the passivation layer comprises Al2O3, the passivation layer is formed by performing an ALD method.

In operation 214, a dielectric layer, e.g., dielectric layer 120, is formed over the laminate layer, e.g., laminate layer 116 (as shown in FIG. 1, FIG. 4 and FIGS. 5-8). In some embodiments, the dielectric layer has a thickness ranging from about 3 nm to about 50 nm. In some embodiments, the dielectric layer comprises a dielectric material selected from $SiN_x$, $SiO_x$, $Al_2O_3$, $Sc_2O_3$, $Ga_2O_3$, $La_2O_3$, $HfO_2$, $ZrO_2$, or any combinations thereof, and multi-layers thereof. In some embodiments, the dielectric layer dielectric layer is formed using ALD, PECVD or LPCVD. In some embodiments, dielectric layer is formed in an amorphous or non-crystallization structure which is formed at a lower temperature than laminate layer.

Figure 7:
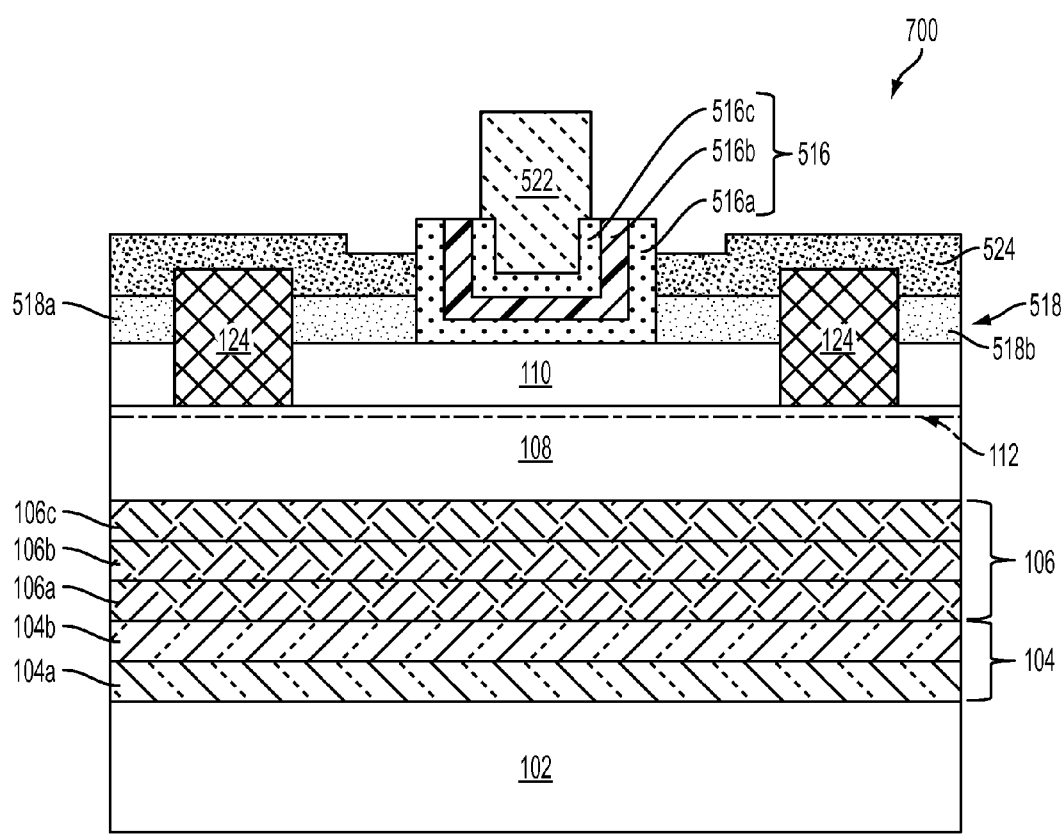
FIG. 7 is a cross-sectional view of a HEMT in accordance with one or more embodiments.

In some embodiments, operation 214 is omitted. Operation 214 is omitted, e.g., in embodiments which do not include a dielectric layer over the laminate layer, e.g., HEMT structure 700 (FIG. 7). In some embodiments, operation 214 is omitted in the formation of HEMT structure 100, 400, 500, 600, 700 or 800. In some embodiments, operation 214 is omitted where the gate, e.g., gate 122, is in direct contact with the laminate layer, e.g., laminate layer 116.

Figure 6:
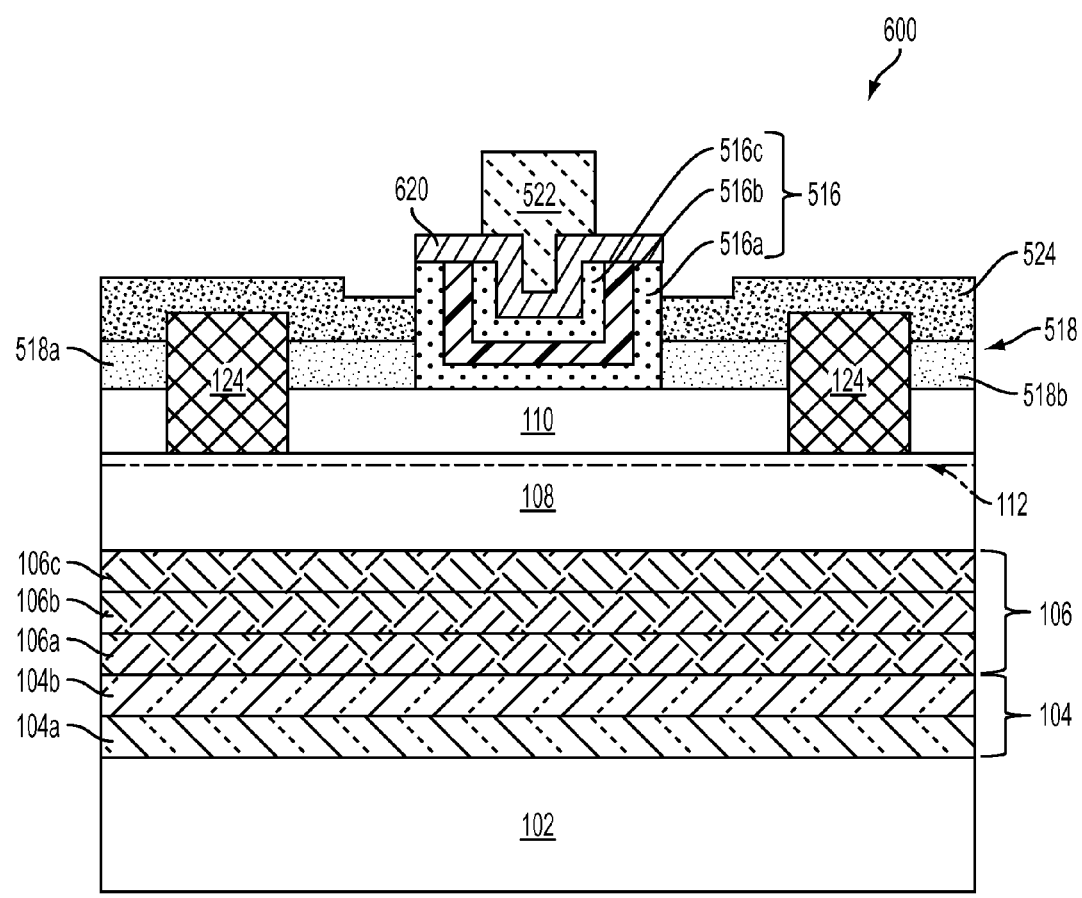
FIG. 6 is a cross-sectional view of an enhanced high electron mobility transistor (E-HEMT) in accordance with one or more embodiments.

Method 200 continues with operation 216 in which a semiconductor material, e.g., semiconductor material 620, is formed over the laminate layer, e.g., laminate layer 116 (as shown in FIG. 6). In some embodiments, semiconductor material is a group III-V semiconductor material such as GaN, AlGaN, InGaN, or another suitable group III-V semiconductor material. In some embodiments, semiconductor material is doped with p-type or n-type dopants. In some embodiments, the p-type dopants include carbon, iron, magnesium, zinc or other suitable p-type dopants. In some embodiments, the n-type dopants include silicon, oxygen or other suitable n-type dopants.

In some embodiments, operation 216 is omitted. Operation 216 is omitted, e.g., in embodiments which do not include a semiconductor material formed over the laminate layer, e.g., HEMT structure 100, 400, 500, 700 and 800 (FIGS. 1, 4-5 and 7-8).

Method 200 continues with operation 218 in which a gate, e.g., gate 122, is formed over the laminate layer, e.g., laminate layer 116. In some embodiments, the gate includes one or more layers of conductive materials. In some embodiments, the formation of the gate includes depositing a blanket gate electrode layer over the dielectric layer, filling the second recess in the dielectric layer and performing lithography and etching processes on the gate electrode layer to define the gate. In some embodiments, the gate comprises a conductive material including one or more refractory metals or respective compounds, including titanium (Ti), titanium nitride (TiN), titanium tungsten (TiW), Tantalum (Ta), Tantalum nitride (TaN), and tungsten (W). In some embodiments, the gate comprises nickel (Ni), gold (Au), copper (Cu), or any alloys thereof. In at least one embodiment, the gate includes at least one barrier layer contacting the channel layer and/or the active layer.

In operation 220, one or more electrodes, e.g., electrodes 124 are formed on the channel layer, e.g., channel layer 108. In some embodiments, the electrodes act as a source and a drain for the HEMT (as shown in FIGS. 1 and 4-8). In some embodiments, the electrodes extend through one or more of the dielectric layer, passivation layer, laminate layer or active layer. In some embodiments, a patterned mask layer (i.e., a photoresistive layer) is formed on the upper surface of the passivation layer, e.g., passivation layer 118, or the dielectric layer, e.g., dielectric layer 120, and an etching process is performed to remove a portion of the passivation layer or the dielectric layer to form openings partially exposing an upper surface of the other portion of the channel layer. A metal layer is then deposited over the patterned passivation layer or the patterned dielectric layer and fills the openings and contacts the other portion of the channel layer. Another patterned photoresist layer is formed over the metal layer, and the metal layer is etched to form the electrodes over the openings. In some embodiments, the metal layer for forming the electrodes includes one or more conductive materials. In some embodiments, the electrodes include one or more layers of conductive materials. In at least one embodiment, the electrodes include at least one barrier layer contacting the other portion of the channel layer. In some embodiments, the electrodes comprise one or more of Ti, Co, Ni, W, Pt, Ta, Pd, Mo, Al, TiN, AlCu alloy, or alloys thereof.

Figure 3A:
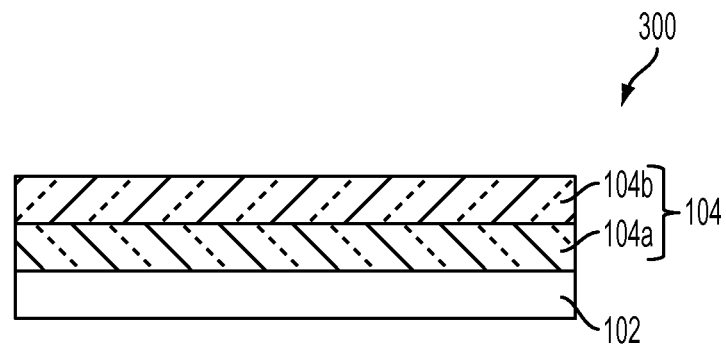
FIGS. 3A-3I are cross-sectional views of a HEMT at various stages of production in accordance with one or more embodiments.

FIG. 3A is a cross-sectional view of a HEMT 300 following operation 202 in accordance with one or more embodiments. HEMT 300 is an embodiment of HEMT 100 with similar elements. As shown in FIG. 3A, similar elements have a same reference number as shown in FIG. 1. HEMT 300 includes buffer layer 104 on substrate 102. In some embodiments, buffer layer 104 comprises multiple layers. Buffer layer 104 comprises a first buffer layer 104a on substrate 102 and a second buffer layer 104b on the first buffer layer 104a.

Figure 3B:
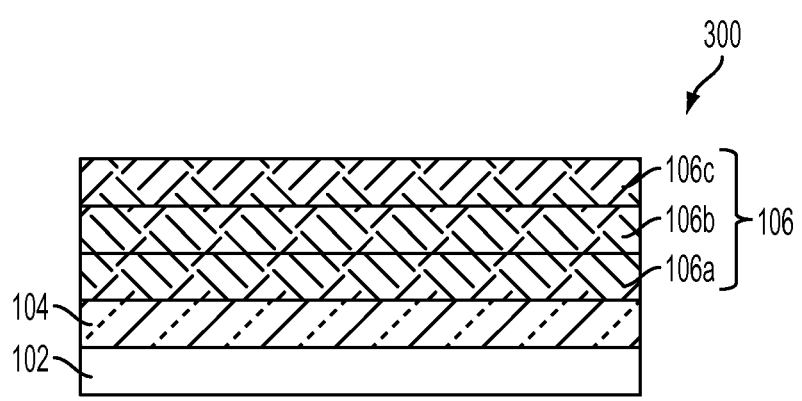

FIG. 3B is a cross-sectional view of a HEMT 300 following operation 204 in accordance with one or more embodiments. HEMT 300 is an embodiment of HEMT 100 with similar elements. As shown in FIG. 3B, similar elements have a same reference number as shown in FIG. 1. HEMT 300 includes graded layer 106 on buffer layer 104. In some embodiments, graded layer 106 comprises multiple layers. Graded layer 106 comprises a first graded layer 106a on buffer layer 104, a second graded layer 106b on the first graded layer 104a and a third graded layer 106c on the second graded layer 104b.

Figure 3C:
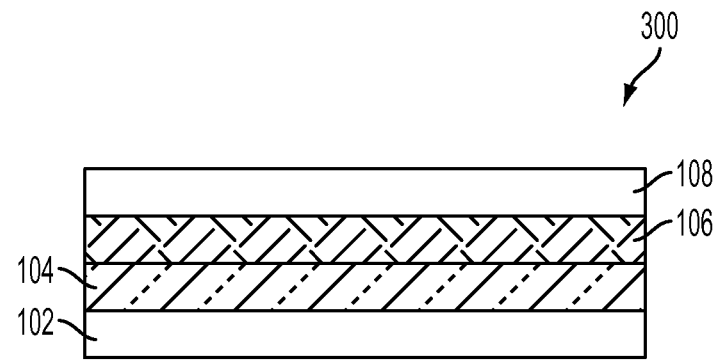

FIG. 3C is a cross-sectional view of a HEMT 300 following operation 206 in accordance with one or more embodiments. HEMT 300 is an embodiment of HEMT 100 with similar elements. As shown in FIG. 3C, similar elements have a same reference number as shown in FIG. 1. HEMT 300 includes channel layer 108 on graded layer 106. For the sake of simplicity, buffer layer 104 and graded layer 106 are shown as single layers in the remaining cross-sectional views of HEMT 300 shown in FIGS. 3C-3J.

Figure 3D:
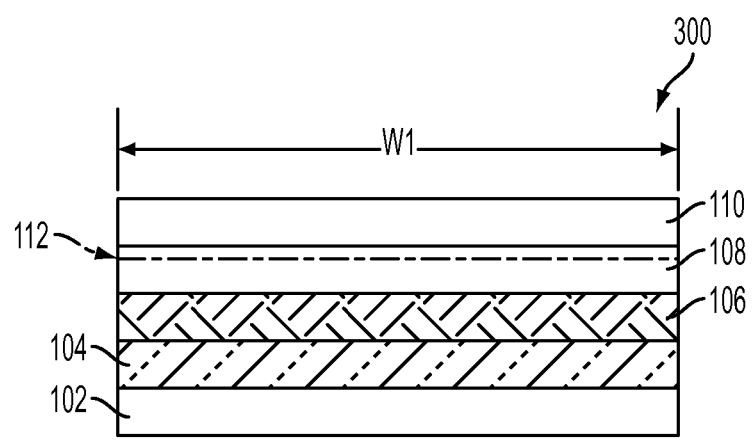

FIG. 3D is a cross-sectional view of a HEMT 300 following operation 208 in accordance with one or more embodiments. HEMT 300 is an embodiment of HEMT 100 with similar elements. As shown in FIG. 3D, similar elements have a same reference number as shown in FIG. 1. HEMT 300 includes active layer 110 on channel layer 108. 2-DEG 112 is formed in channel layer 108 due to the band gap discontinuity between active layer 110 and the channel layer 108. As shown in FIG. 3D, the active layer 110 has a width W1.

Figure 3E:
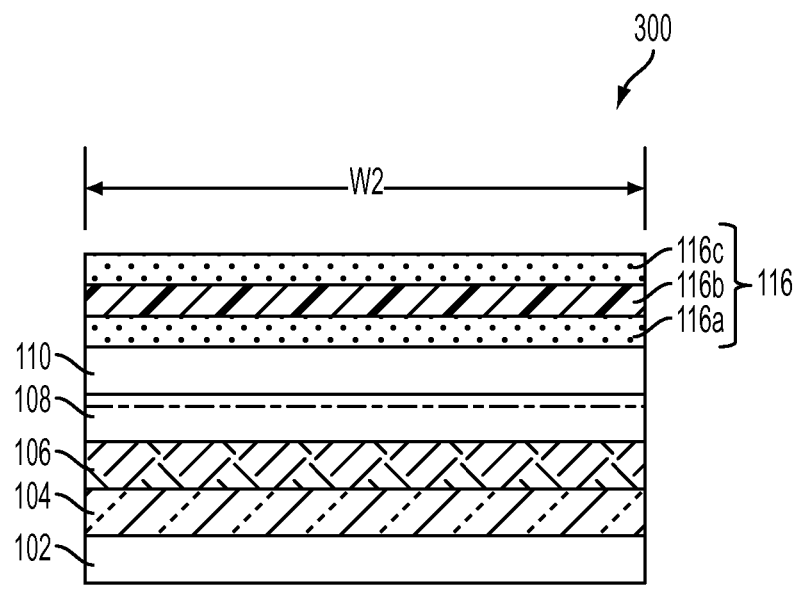

FIG. 3E is a cross-sectional view of a HEMT 300 following operation 210 in accordance with one or more embodiments. HEMT 300 is an embodiment of HEMT 100 with similar elements. As shown in FIG. 3E, similar elements have a same reference number as shown in FIG. 1. HEMT 300 includes laminate layer 116 over active layer 110. In some embodiments, laminate layer 116 is on active layer 110. In some embodiments, laminate layer 116 is on channel layer 108. Laminate layer 116 includes multiple layers. In some embodiments, laminate layer 116 comprises a first crystalline layer 116a on the underlying layer (e.g., active layer 110 or channel layer 108), a blocking layer 116b on the first crystalline layer 116a and a second crystalline layer 116c on the blocking layer 116b. In some embodiments, the first crystalline layer 116a is substantially flush with the underlying layer (e.g., active layer 110 or channel layer 108). In some embodiments, the blocking layer 116b is substantially flush with the first crystalline layer 116a. In some embodiments, second crystalline layer 116c is substantially flush with the blocking layer 116b. In some embodiments, the second crystalline layer 116c is optional. In some embodiments, the laminate layer 116 comprises an alternating sequence of one or more blocking layers 116b and one or more second crystalline layers 116c, both formed over the first crystalline layer 116a.

As shown in FIG. 3E, the laminate layer 116 has a width W2. In some embodiments, the width W2 of the laminate layer 116 is substantially equal to the width W1 of the active layer 110 (shown in FIGS. 3D and 3E). In some embodiments, the width W2 of the laminate layer 116 is substantially equal to the width W3 of the gate 122 (shown in FIGS. 3E and 3H). In some embodiments, the width W2 of the laminate layer 116 is less than the width W3 of the gate 122 (shown in FIGS. 3E and 3H).

Figure 3F:
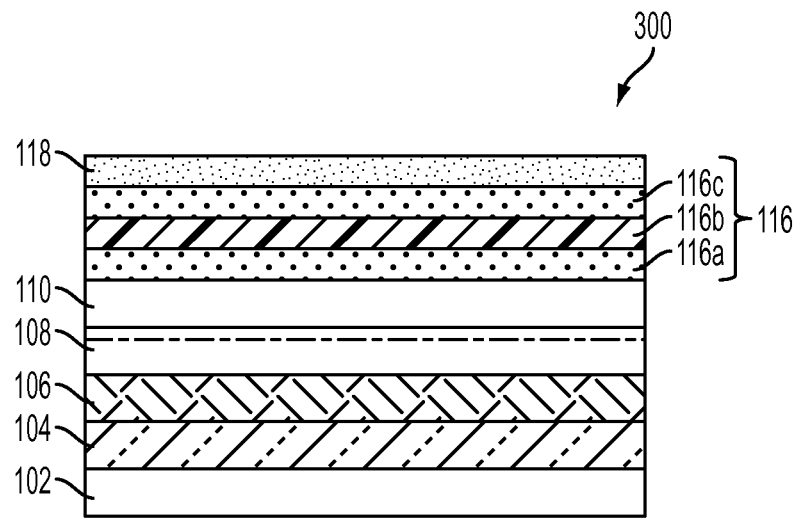

FIG. 3F is a cross-sectional view of a HEMT 300 following operation 212 in accordance with one or more embodiments. HEMT 300 is an embodiment of HEMT 100 with similar elements. As shown in FIG. 3F, similar elements have a same reference number as shown in FIG. 1. HEMT 300 includes passivation layer 118 on laminate layer 116. In some embodiments, the bottom surface of the passivation layer 118 is on the top surface of the second crystalline layer 116c. In some embodiments, the bottom surface of the passivation layer 118 is on the top surface of the blocking layer 116b. In some embodiments, passivation layer comprises a first passivation portion 118a and the second passivation portion 118b (shown in FIGS. 1 and 3G-3I). In some embodiments, the first passivation portion 118a and the second passivation portion 118b are separated by a first recess 126.

Figure 3G:
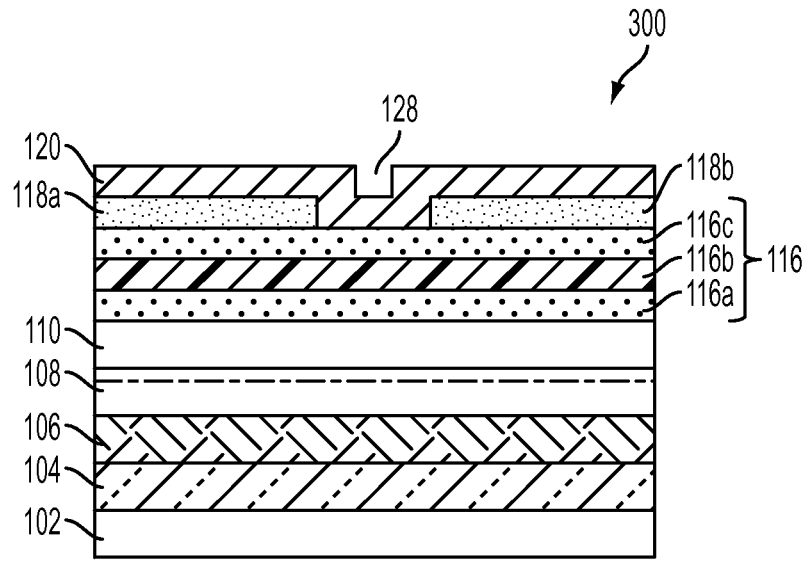

FIG. 3G is a cross-sectional view of a HEMT 300 following operation 214 in accordance with one or more embodiments. HEMT 300 is an embodiment of HEMT 100 with similar elements. As shown in FIG. 3G, similar elements have a same reference number as shown in FIG. 1. HEMT 300 includes dielectric layer 120 on passivation layer 118. In some embodiments, dielectric layer 120 is at least partially on laminate layer 116. In some embodiments, dielectric layer 120 at least partially fills the first recess 126 between the first passivation portion 118a and the second passivation portion 118b. In some embodiments, a portion of the dielectric layer 120 is formed on the top surface of the laminate layer 116. In some embodiments, a second recess 128 is formed in a central portion of the dielectric layer 120. In some embodiments, dielectric layer 120 is optional. For example, dielectric layer 120 is optional where the gate 122 is in direct contact with laminate layer 116. In some embodiments, where dielectric layer 120 is utilized, HEMT 100 comprises a depletion-mode MISFET.

Figure 3H:
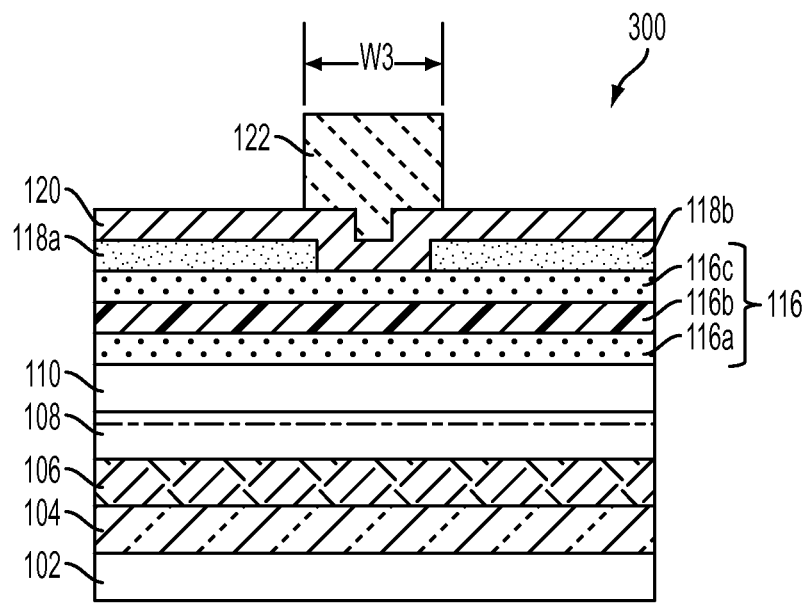

FIG. 3H is a cross-sectional view of a HEMT 300 following operation 218 in accordance with one or more embodiments. HEMT 300 is an embodiment of HEMT 100 with similar elements. As shown in FIG. 3H, similar elements have a same reference number as shown in FIG. 1. HEMT 300 includes gate 122 on dielectric layer 120. In some embodiments, a portion of the gate 122 extends into second recess 128. In some embodiments, a portion of the gate 122 overlaps a portion of the passivation layer 118 or a portion of the dielectric layer 120. In some embodiments, dielectric layer 120 separates gate 122 from passivation layer 118 or laminate layer 116. As shown in FIG. 3H, the gate 122 has a width W3.

Figure 3I:
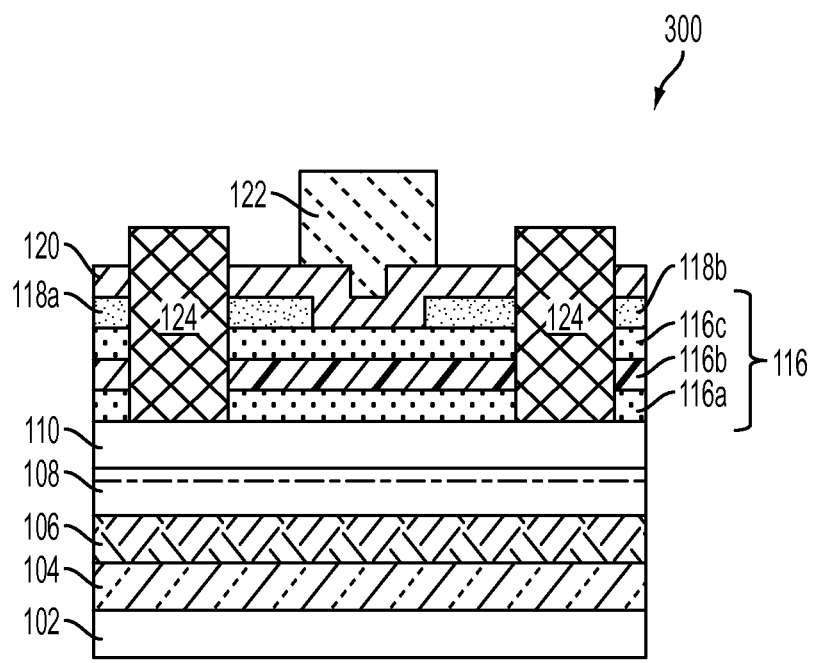

FIG. 3I is a cross-sectional view of a HEMT 300 following operation 220 in accordance with one or more embodiments. HEMT 300 is an embodiment of HEMT 100 with similar elements. As shown in FIG. 3I, similar elements have a same reference number as shown in FIG. 1. HEMT 300 includes electrodes 124 on active layer 110. In some embodiments, electrodes 124 act as a source and a drain for HEMT 100 for transferring a signal into or out of the HEMT 100. In some embodiments, electrodes 124 are formed on the opposite sides of the gate 122. In some embodiments, the electrodes 124 extend through one or more of the dielectric layer 120, passivation layer 118, laminate layer 116 or active layer 110. As shown in FIG. 3I, HEMT 300 has a structure similar to HEMT 100 (shown in FIG. 1).

FIG. 4 is a cross-sectional view of a HEMT 400 in accordance with one or more embodiments. HEMT 400 is an embodiment of HEMT 100 with similar elements. As shown in FIG. 4, similar elements have a same reference number as shown in FIG. 1. In comparison with HEMT 100, HEMT 400 comprises laminate layer 416, passivation layer 418, dielectric layer 420 and gate 422. Laminate layer 416 is an embodiment of laminate layer 116 shown in FIG. 1. Passivation layer 418 is an embodiment of passivation layer 118 shown in FIG. 1. Dielectric layer 420 is an embodiment of dielectric layer 120 shown in FIG. 1. Gate 422 is an embodiment of gate 122 shown in FIG. 1.

Laminate layer 416 is on active layer 110. Laminate layer 416 comprises multiple layers. Laminate layer 416 comprises first crystalline layer 416a, blocking layer 416b and second crystalline layer 416c. First crystalline layer 416a is an embodiment of first crystalline layer 116a shown in FIG. 1. Blocking layer 416b is an embodiment of blocking layer 116b shown in FIG. 1. Second crystalline layer 416c is an embodiment of second crystalline layer 116c shown in FIG. 1. Laminate layer 416 has a width W2. In some embodiments, the width of the gate 422 and the width W2 of the laminate layer 416 are substantially equal. In some embodiments, the width of the dielectric layer 420 and the width W2 of the laminate layer 416 are substantially equal. In some embodiments, the width of the gate 422 and the width of the dielectric layer 420 are substantially equal. In some embodiments, the width W2 of the laminate layer 416 is less than the width W1 of the active layer 110. In some embodiments, the width W2 of the laminate layer 416 is less than the width W4 of the central passivation region 426.

Dielectric layer 420 is on laminate layer 416. In some embodiments, the bottom surface of the dielectric layer 420 is substantially flush with the top surface of the laminate layer 416. In some embodiments, one or more side surfaces of the dielectric layer 420 are substantially flush with one or more side surfaces of the laminate layer 416. In some embodiments, the dielectric layer 420 is optional. For example, dielectric layer 420 is optional where the gate 422 is in direct contact with laminate layer 416. In some embodiments, where dielectric layer 420 is utilized, HEMT 400 comprises a depletion mode MISFET.

Gate 422 is on dielectric layer 420. In some embodiments, the bottom surface of the gate 422 is substantially flush with the top surface of the dielectric layer 420. In some embodiments, one or more side surfaces of the gate 422 are substantially flush with one or more side surfaces of the dielectric layer 420.

Passivation layer 418 is on gate 422. In some embodiments, a portion of passivation layer 418 is on gate 422, dielectric layer 420, laminate layer 416 or active layer 110. Passivation layer 418 comprises a central passivation region 426. Central passivation region has a width W4. In some embodiments, the width W2 of the laminate layer 416 is less than the width W4 of the central passivation region 426. In some embodiments, the passivation layer 418 at least partially encapsulates one or more of the gate 422, dielectric layer 420, laminate layer 416 or active layer 110.

Figure 5:
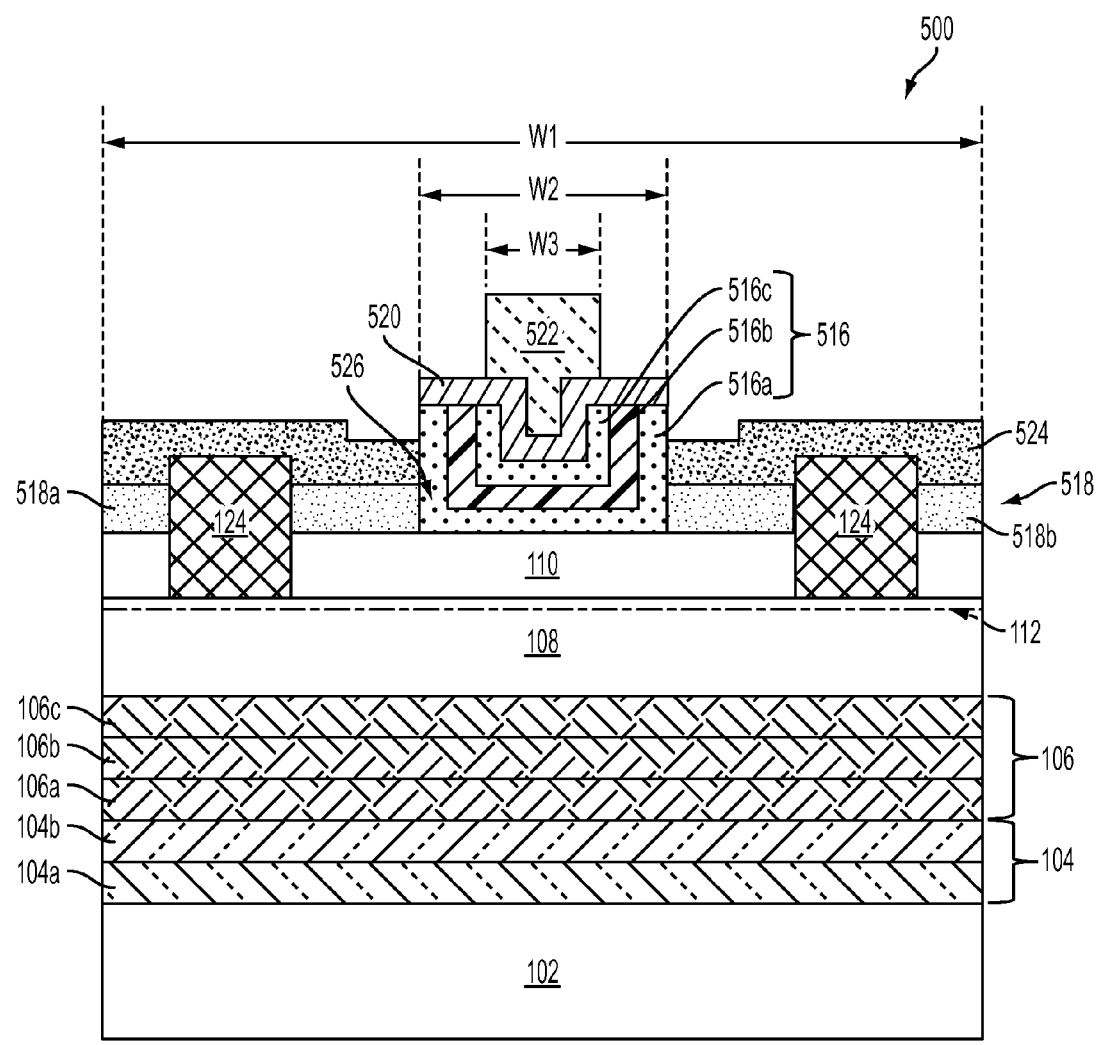
FIG. 5 is a cross-sectional view of a depletion metal-insulator-semiconductor field-effect transistor (D-MISFET) in accordance with one or more embodiments.

FIG. 5 is a cross-sectional view of a HEMT 500 in accordance with one or more embodiments. HEMT 500 is an embodiment of HEMT 100 with similar elements. As shown in FIG. 5, similar elements have a same reference number as shown in FIG. 1. In comparison with HEMT 100, HEMT 500 comprises laminate layer 516, passivation layer 518, dielectric layer 520, gate 522 and capping layer 524. Laminate layer 516 is an embodiment of laminate layer 116 shown in FIG. 1. Passivation layer 518 is an embodiment of passivation layer 118 shown in FIG. 1. Dielectric layer 520 is an embodiment of dielectric layer 120 shown in FIG. 1. Gate 522 is an embodiment of gate 122 shown in FIG. 1.

Laminate layer 516 is on active layer 110. Laminate layer 516 comprises multiple layers. Laminate layer 516 comprises first crystalline layer 516a, blocking layer 516b and second crystalline layer 516c. First crystalline layer 516a is an embodiment of first crystalline layer 116a shown in FIG. 1. Blocking layer 516b is an embodiment of blocking layer 116b shown in FIG. 1. Second crystalline layer 516c is an embodiment of second crystalline layer 116c shown in FIG. 1. Laminate layer 516 has a width W2. In some embodiments, the width W2 of the laminate layer 516 is greater than the width W3 of the gate 522. In some embodiments, the width W2 of the laminate layer 516 is less than the width W1 of the active layer 110. In some embodiments, the width of the dielectric layer 520 and the width W2 of the laminate layer 516 are substantially equal. In some embodiments, laminate layer 516 is in a recess 526 of the passivation later 518.

Passivation layer 518 is on active layer 110. Passivation layer 518 comprises a first passivation portion 518a and a second passivation portion 518b. In some embodiments, the first passivation portion 518a and the second passivation portion 518b are separated by a recess 526. In some embodiments, the passivation region 518 extends around the perimeter of the electrodes 124.

Dielectric layer 520 is on laminate layer 516. In some embodiments, at least a portion of the bottom surface of the dielectric layer 520 is substantially flush with at least a portion of the top surface of the laminate layer 516. In some embodiments, one or more side surfaces of the dielectric layer 520 are substantially flush with one or more side surfaces of the laminate layer 516. In some embodiments, the dielectric layer 520 is optional. For example, dielectric layer 520 is optional where the gate 522 is in direct contact with laminate layer 516. In some embodiments, where dielectric layer 520 is utilized, HEMT 500 comprises a depletion mode MISFET.

Gate 522 is on dielectric layer 520. In some embodiments, the bottom surface of the gate 522 is substantially flush with the top surface of the dielectric layer 520. The gate 522 has a width W3.

Capping layer 524 is on one or more of the electrodes 124 or passivation layer 518. In some embodiments, capping layer 524 is on one or more of the top surfaces of the electrodes 124 or the side surfaces of the electrodes 124. In some embodiments, capping layer 524 is on the top surfaces of the passivation layer 518. In some embodiments, capping layer 524 has a thickness ranging from about 100 Å to about 5000 Å. In some embodiments, capping layer 524 comprises a dielectric material selected from $SiO_x$ or $SiN_x$, or any combinations thereof, and multi-layers thereof. In some embodiments, the capping layer 524 comprises $SiN_x$, where x ranges from about 0.5 to about 1.33. In some embodiments, the capping layer 524 comprises $SiO_x$, where x ranges from about 0.5 to about 2.1. In some embodiments, the capping layer 524 is formed using CVD, spin-on polymeric dielectric or other suitable formation processes.

FIG. 6 is a cross-sectional view of a HEMT 600 in accordance with one or more embodiments. HEMT 600 is an embodiment of HEMT 500 with similar elements. As shown in FIG. 6, similar elements have a same reference number as shown in FIG. 5. In comparison with HEMT 500, HEMT 600 comprises semiconductor material 620. In comparison with HEMT 500, HEMT 600 does not include dielectric layer 520. In some embodiments, semiconductor material 620 is substituted into the position of the dielectric layer 520 (shown in FIG. 5).

Semiconductor material 620 is over laminate layer 516. In some embodiments, semiconductor material 620 is on laminate layer 516. In some embodiments, at least a portion of the bottom surface of the semiconductor material 620 is substantially flush with at least a portion of the top surface of the laminate layer 516. In some embodiments, one or more side surfaces of the semiconductor material 620 are substantially flush with one or more side surfaces of the laminate layer 516. In some embodiments, where semiconductor material 620 is utilized, HEMT 600 comprises an Enhanced HEMT (E-HEMT). In some embodiments, semiconductor material 620 is a group III-V semiconductor material such as GaN, AlGaN, InGaN, or another suitable group III-V semiconductor material. In some embodiments, semiconductor material 620 is doped with p-type or n-type dopants. In some embodiments, the p-type dopants include carbon, iron, magnesium, zinc or other suitable p-type dopants. In some embodiments, the n-type dopants include silicon, oxygen or other suitable n-type dopants.

FIG. 7 is a cross-sectional view of a HEMT 700 in accordance with one or more embodiments. HEMT 700 is an embodiment of HEMT 500 with similar elements. As shown in FIG. 7, similar elements have a same reference number as shown in FIG. 5. In comparison with HEMT 500, HEMT 700 does not include dielectric layer 520.

Figure 8:
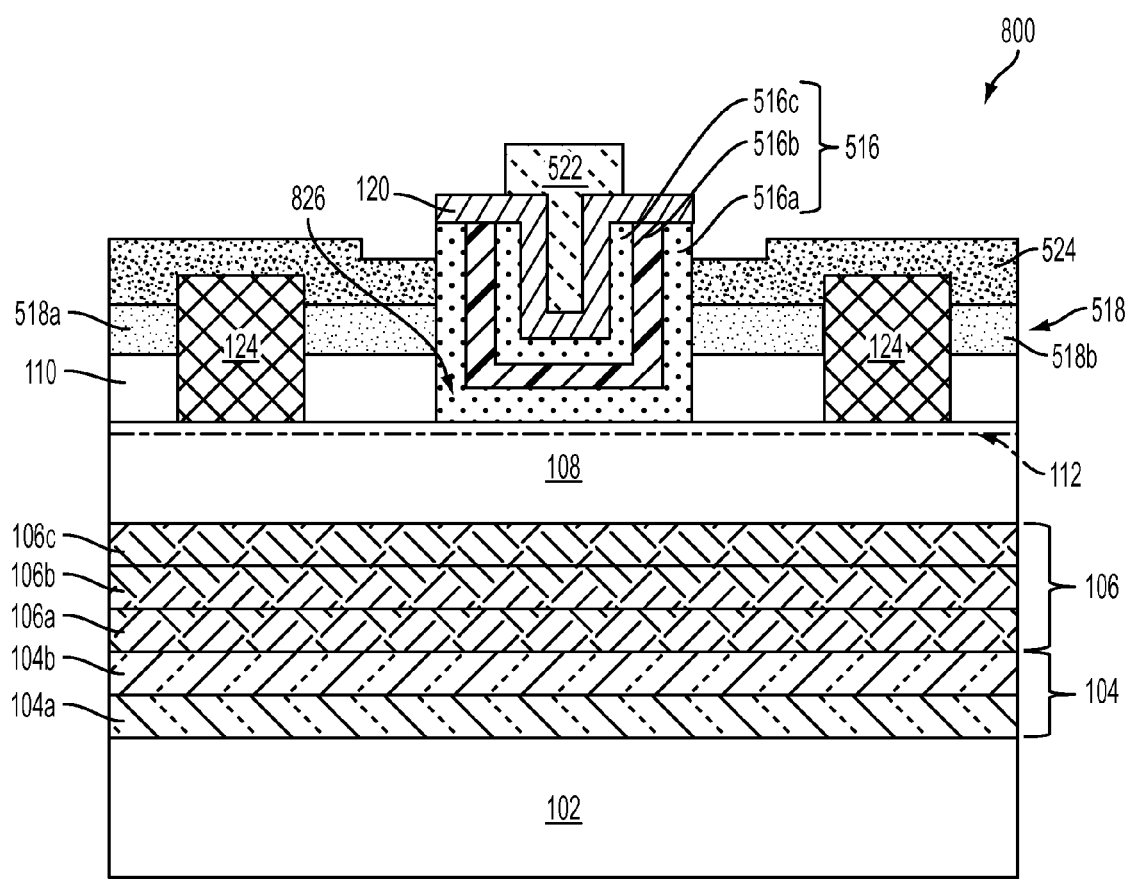
FIG. 8 is a cross-sectional view of an enhanced metal-insulator-semiconductor field-effect transistor (E-MISFET) in accordance with one or more embodiments.

FIG. 8 is a cross-sectional view of a HEMT 800 in accordance with one or more embodiments. HEMT 800 is an embodiment of HEMT 500 with similar elements. As shown in FIG. 8, similar elements have a same reference number as shown in FIG. 5. In comparison with HEMT 500, HEMT 800 comprises laminate layer 516 on the active layer 108. In some embodiments, a recess 826 is formed in a central portion of the active layer 110. In some embodiments, at least a portion of the laminate layer 516 is in the recess 826 of the active layer 110. In some embodiments, a bottom surface of the laminate layer 516 is on the top surface of the channel layer 108. In some embodiments, HEMT 800 comprises an Enhanced MISFET (E-MISFET).

One aspect of this description relates to a semiconductor device comprising a substrate, a channel layer over the substrate, an active layer over the channel layer and a laminate layer in contact with the active layer. Further, the active layer has a band gap discontinuity with the channel layer.

Another aspect of this description relates to a transistor comprising a substrate, a buffer layer over the substrate, a graded layer over the buffer layer, a channel layer over the graded layer, an active layer over the channel layer and a laminate layer in contact with the active layer. Furthermore, the active layer has a band gap discontinuity with the channel layer.

Still another aspect of this description relates to a method of making a semiconductor device. The method comprises forming a buffer layer over a substrate, forming a graded layer over the buffer layer, forming a channel layer over the graded layer, forming an active layer over the channel layer and forming a laminate layer in contact with the active layer. Furthermore, the active layer has a band gap discontinuity with the channel layer.

One of ordinary skill in the art would recognize that an order of operations in method 200 is adjustable. One of ordinary skill in the art would further recognize that additional steps are able to be included in method 200 without departing from the scope of this description.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a channel layer over the substrate;
   an active layer over the channel layer, wherein the active layer has a band gap discontinuity with the channel layer; and
   a laminate layer separate from a gate and in contact with the active layer, the laminate layer comprising a first crystalline layer, a blocking layer over the first crystalline layer, and a second crystalline layer over the blocking layer.

2. The semiconductor device of claim 1, further comprising:
   a first electrode on the channel layer;
   a second electrode on the channel layer; and
   the gate between the first electrode and the second electrode, wherein the gate is configured to control a conductivity of a two-dimensional electron gas (2-DEG) between the first electrode and the second electrode.

3. The semiconductor device of claim 2, wherein the gate is on the laminate layer, and the semiconductor device is configured to be normally conductive.

4. The semiconductor device of claim 2, further comprising a dielectric layer on the laminate layer, wherein the gate is on the dielectric layer.

5. The semiconductor device of claim 1, wherein the first crystalline layer or the second crystalline layer comprises at least one semiconductor material selected from AlN and $In_xAl_yGa_zN$.

6. The semiconductor device of claim 1, wherein the blocking layer comprises at least one member selected from $AlO_x$, $SiN_x$, $SiO_x$, $MgO$, $Ga_2O_3$, $La_2O_3$, $HfO_2$, $ZrO_2$, $Y_2O_3$, $Gd_2O_3$, $Ce_2O_3$ or $Ta_2O_3$.

7. The semiconductor device of claim 1, wherein a thickness of the first crystalline layer ranges from about 3 Å to about 10 Å.

8. The semiconductor device of claim 1, wherein a thickness of the blocking layer ranges from about 3 Å to about 50 Å.

9. The semiconductor device of claim 1, wherein a thickness of the second crystalline layer ranges from about 3 Å to about 50 Å.

10. The semiconductor device of claim 1, further comprising a passivation layer over the laminate layer.

11. The semiconductor device of claim 10, further comprising a capping layer over the passivation layer.

12. A transistor comprising:
    a substrate;
    a buffer layer over the substrate;
    a graded layer over the buffer layer;
    a channel layer over the graded layer;
    an active layer over the channel layer, wherein the active layer has a band gap discontinuity with the channel layer; and
    a laminate layer separate from a gate and in contact with the active layer, wherein the laminate layer comprises:
      a first crystalline layer, wherein a bottom surface of the first crystalline layer is in contact with a top surface of the active layer;
      a blocking layer comprising a bottom surface in contact with a top surface of the first crystalline layer, and
      a second crystalline layer over the blocking layer.

13. The transistor of claim 12, further comprising:
    a first electrode on the channel layer;
    a second electrode on the channel layer; and
    the gate between the first electrode and the second electrode, wherein the gate is configured to control a conductivity of a two-dimensional electron gas (2-DEG) between the first electrode and the second electrode.

14. A semiconductor device, comprising:
    a channel layer over a substrate;
    an active layer over the channel layer, wherein the active layer has a band gap discontinuity with the channel layer;
    a pair of electrodes over the channel layer;
    a gate between the pair of electrodes; and a laminate layer under the gate, the laminate layer comprising blocking layer over the active layer and a second crystalline layer over the blocking layer.

15. The semiconductor device of claim 14, wherein the laminate layer comprises:
a first crystalline layer over the active layer and under the blocking layer.

16. The semiconductor device of claim 15, wherein the first crystalline layer or the second crystalline layer comprises at least one semiconductor material selected from AlN or $In_xAl_yGa_zN$.

17. The semiconductor device of claim 14, wherein the blocking layer comprises at least one member selected from $AlO_x$, $SiN_x$, $SiO_x$, MgO, $Ga_2O_3$, $La_2O_3$, $HfO_2$, $ZrO_2$, $Y_2O_3$, $Gd_2O_3$, $Ce_2O_3$ or $Ta_2O_3$.

* * * * *